(12) United States Patent
Nakagawa

(10) Patent No.: US 7,081,304 B2
(45) Date of Patent: Jul. 25, 2006

(54) SURFACE CONDUCTIVE RESIN, PROCESS FOR FORMING THE SAME AND WIRING BOARD

(75) Inventor: Kanae Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 235 days.

(21) Appl. No.: 10/351,353

(22) Filed: Jan. 27, 2003

(65) Prior Publication Data

US 2003/0143411 A1    Jul. 31, 2003

(30) Foreign Application Priority Data

Jan. 28, 2002   (JP) ............................. 2002-018285

(51) Int. Cl.
*B32B 27/16* (2006.01)
*B32B 27/06* (2006.01)
*B32B 15/08* (2006.01)
*B32B 37/00* (2006.01)
*B05D 1/38* (2006.01)

(52) U.S. Cl. .................. 428/473.5; 428/457; 428/458; 428/901; 427/96.1; 427/118; 427/123; 427/125; 427/302; 427/304; 427/404; 427/407.1

(58) Field of Classification Search .................. 427/58, 427/96, 117, 118, 123, 125, 299, 302, 304, 427/402, 404, 407.1, 409, 410, 385.5, 386; 428/413, 414, 416, 418, 457, 473.5, 474.4, 428/901; 174/102 C
See application file for complete search history.

(56) References Cited

U.S. PATENT DOCUMENTS 6,709,806 B1 *  3/2004  Hotta et al. .................. 430/322
6,899,999 B1 *  5/2005  Hiraoka et al. ............. 430/311

FOREIGN PATENT DOCUMENTS

JP        9-246716       9/1997

* cited by examiner

Primary Examiner—Michael J. Feely
(74) Attorney, Agent, or Firm—Armstrong, Kratz, Quintos, Hanson & Brooks, LLP

(57) ABSTRACT

The present invention aims to provide a surface-conductive resin suitable for wiring boards, and the like, a process for forming the resin efficiently, and a wiring board using the surface-conductive resin. The surface-conductive resin according to the present invention is formed by selectively generating reactive groups capable of substitution under alkaline conditions on the resin surface, bringing the reactive groups into contact with an alkaline solution so that part of the reactive groups are substituted by alkali metal ions, bringing the substituted parts by the alkali metal ions into contact with ions of a conductive material so that the alkali metal ions are substituted by ions of the conductive material, and reducing the ions of the conductive material so that the conductive material deposits on the resin surface.

27 Claims, 10 Drawing Sheets

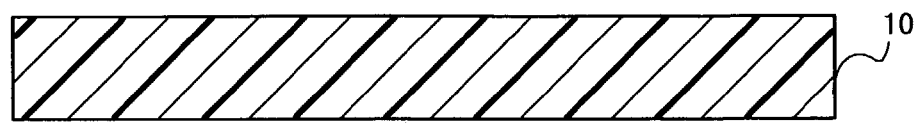
FIG. 3A
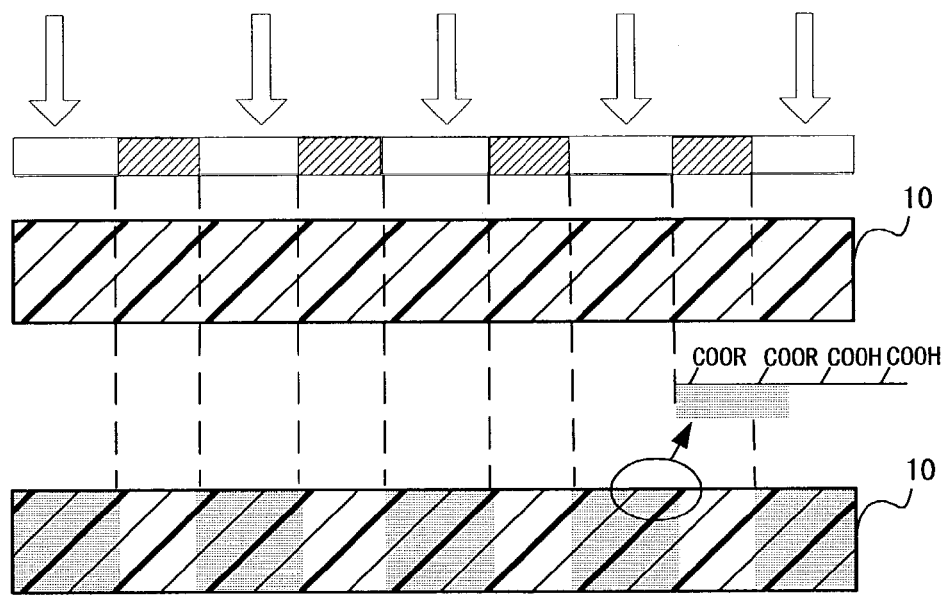
FIG. 3B
FIG. 3C
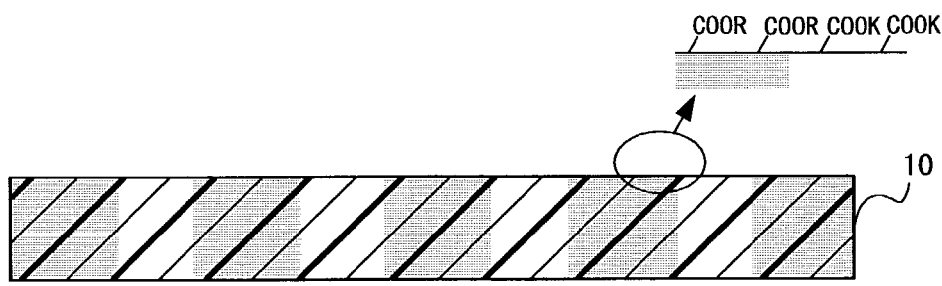
FIG. 3D

SURFACE CONDUCTIVE RESIN, PROCESS FOR FORMING THE SAME AND WIRING BOARD

CROSS-REFERENCE TO RELATED APPLICATIONS

This application is based upon and claims the benefit of priority from the prior Japanese Patent Application No. 2002-018285, filed on Jan. 28, 2002, the entire contents of which are incorporated herein by reference.

BACKGROUND OF THE INVENTION

1. Field of the Invention

The present invention relates to a surface-conductive resin suitable for a wiring board and the like, an efficient process for forming the same, and a wiring board using the same.

2. Description of the Related Art

Various processes for metallizing the surfaces of insulating resins such as polyimide have been proposed to produce wiring boards, and the like. Of these, the dry process, which uses a vacuum device, such as a vacuum deposition device or a sputtering device, was a concrete process for forming a thin metal layer having excellent homogeneity and adhesion. However, the dry process requires a vacuum device, costly equipments such as a clean room, and the like, and it was difficult to form a thin metal layer of complex shape.

Consequently, wet processes, such as non-electrolytic metal plating which do not have the aforementioned problems, have recently been actively studied. In the wet processes such as the aforesaid non-electrolytic metal plating, etching, and the like, is generally performed as a pretreatment to form a very small hole of about 1 μm to 3 μm in the resin surface. The adhesion of the metal plating layer to the resin surface is increased by an anchor effect of the hole. However, it is inefficient to perform a pretreatment such as etching, and if it is carried out on a resin such as polyimide, in respect of that it degrades the properties of the resin, makes an anchor effect impossible and a thin metal layer with excellent homogeneity cannot be obtained.

Due to this situation, such process is desired that it has both advantages of the vacuum process and the non-electrolytic plating, and effectively form a conductive layer on a resin surface. Namely, it is desired to obtain a conductive layer having excellent electrical properties and surface flatness as obtained by the vacuum process, and simple and cost efficient manufacturing process as obtained by the non-electrolytic plating.

SUMMARY OF THE INVENTION

It is therefore an object of the present invention to provide a surface-conductive resin suitable for wiring boards and the like, having a surface-conductive layer with excellent electrical properties and surface flatness, a process for forming the surface-conductive resin at low cost by means of an efficient, simple process without using a vacuum device, and an efficient process for producing a wiring board having excellent electrical properties and surface flatness using the surface-conductive resin at low cost without using a vacuum device.

In the process for forming the surface-conductive resin according to the present invention, at first, reactive groups capable of substitution under alkaline conditions are selectively generated on the surface of a resin. Thereafter, the resin is brought in contact with an alkaline solution to substitute the generated reactive groups by alkali metal ions. Following it, the resin is brought in contact with an ionic solution of a conductive material to substitute the alkali metal ions by ions of the conductive material. Finally, ions of the conductive material are reduced so that the conductive material deposits on the resin surface. This permits the formation of the surface-conductive resin containing a surface layer of the conductive material. Specifically, the present invention has two aspects. In a first aspect, at least one of an acid and a base is generated by light exposure, heating, pressurization, pH variation, addition of substances and the like, and the reactive groups capable of substitution under alkaline conditions are then selectively generated on the resin surface. In a second aspect, the reactive groups capable of substitution under alkaline conditions are selectively generated on the resin surface by applying a stimulus such as light exposure, heating, pressurization, pH variation and addition of substances.

According to the first aspect of the present invention, the resin parts which are stimulated have at least one reactive group capable of substitution under alkaline conditions in every repeating unit, the resin shows positive type reactions, and the layer of conductive material is formed on the surface of the stimulated parts. If the resin is a photosensitive resin, it does not have reactive groups capable of being substitution under alkaline conditions, but when the resin is exposed to a stimulus of light, reactive groups capable of substitution under alkaline conditions are generated, and a layer of conductive material is formed on the surface. If the photosensitive resin contains a photo-acid generator, the reactive groups capable of substitution under alkaline conditions are partially generated in the exposed parts. Further, if the photosensitive resin is polyimide, carboxyl groups are selectively generated in the exposed parts.

According to the second aspect of the present invention, the resin parts, which are not stimulated, have at least one reactive group capable of substitution under alkaline conditions in every repeating unit, the resin parts, which are stimulated, eliminate reactive groups capable of substitution under alkaline conditions, the resin shows negative type reactions, and a layer of conductive material is then formed on the surface of the parts which are not stimulated. If the resin is a photosensitive resin, it has reactive groups capable of substitution under alkaline conditions, and the exposed parts eliminate reactive groups capable of substitution under alkaline conditions. As the resin is a photosensitive resin, a layer of conductive material is formed on the surface of the unexposed parts. If the photosensitive resin contains a photo-base generator, reactive groups capable of substitution under alkaline conditions are partially generated in the unexposed parts. If the photosensitive resin is polyamic acid, carboxyl groups are selectively generated in the non-exposed parts.

The surface-conductive resin of the present invention is formed by the process for forming a surface-conductive resin of the present invention, and has a surface layer of conductive material.

The wiring board of the present invention is formed using the surface-conductive resin of the present invention, and has a pattern of the conductive material on the surface-conductive resin.

BRIEF DESCRIPTION OF THE DRAWINGS

FIGS. 3A, 3B, 3C and 3D are schematic diagrams (1) for the purpose of describing an example of the process for forming a surface-conductive resin using a negative photosensitive resin, wherein a selective pattern of a conductive material is formed on the surface.

Figure 1A:
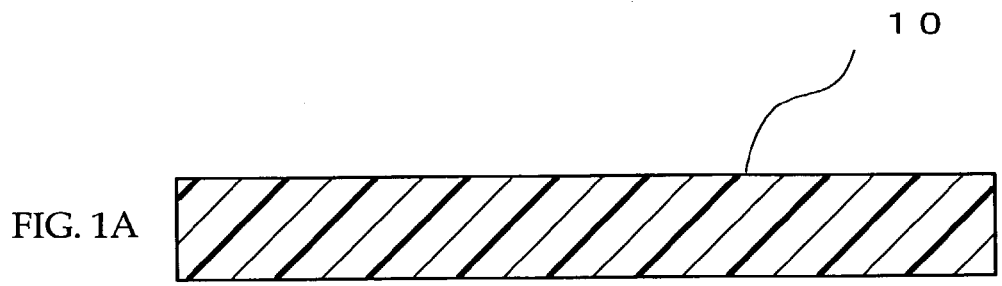
FIGS. 1A, 1B, 1C and 1D are schematic diagrams (1) for the purpose of describing an example of the process for forming a surface-conductive resin using a positive photosensitive resin, wherein a selective pattern of a conductive material is formed on the surface.

DESCRIPTION OF THE PREFERRED EMBODIMENTS (Process for Forming Surface-Conductive Resin)

In the process for forming the surface-conductive resin according to the present invention, reactive groups capable of substitution under alkaline conditions are first selectively generated on the resin surface. Hereafter, this process may be referred to as "step for generating reactive group".

Resin

There is no particular limitation on the resin provided that it can selectively generate reactive groups capable of substitution under alkaline conditions depending on the presence or absence of a stimulus, and it may be suitably selected from among those known in the art according to the intended purpose.

Stimulus

There is no particular limitation on the stimulus which may be suitably selected according to the purpose, for example light exposure, heating, pressurization, pH variation, addition of substances, and the like. Among those, the light exposure is preferred. If the light exposure is selected as the stimulus, a photosensitive resin may suitably be used as the resin.

There is no particular limitation on the process of applying the stimulus, which may be suitably selected according to the intended purpose. For example, it may be applied by coating the resin on a substrate.

There is no particular limitation on the substrate which may be suitably selected from among those known in the art according to the intended purpose. Example may include a glass substrate, a silicon plate, an aluminum nitride plate, and the like.

There is no particular limitation on the coating process which may be suitably selected from among those known in the art. Examples thereof may include spin coating, bar coating, blade coating, bead coating, air knife coating, spray coating, immersion coating, curtain coating, and the like.

After the resin has been coated on the substrate by the abovementioned coating processes, according to the present invention, a drying process may also appropriately applied depending on the intended purpose.

The stimulus may be applied to either the whole or a part of the resin surface. If the surface-conductive resin obtained is used as a wiring board and the like, however, the stimulus is preferably applied as a patterned form. The stimulus may be given once, twice or more.

If the stimulus is applied in the form of a pattern, there is no particular limitation on the process. In the case of light exposure, for example, it may be suitably performed through a pattern mask. There is no particular limitation on the pattern mask, which may be suitably selected from any conventional pattern masks having the predetermined pattern.

There is no particular limitation on the light exposure process which may be suitably selected according to the intended purpose. For example, the light irradiation amount during exposure is preferably in the range of 50 mJ/cm$^2$ to 400 mJ/cm$^2$, and more preferably 100 mJ/cm$^2$ to 300 mJ/cm$^2$. If the light irradiation amount is less than 50 mJ/cm$^2$, the pattern may not be formed, and if it is more than 500 mJ/cm$^2$, bleeding of the pattern may occur due to overexposure. Moreover the light irradiation time is preferably in the range of 30 seconds to 10 minutes.

It is preferred that the resin contains at least one of an acid generator and a base generator. In this case, at least one of the acid generator and the base generator reacts with parts of the reactive groups in the resin at the resin parts, which received the stimulus, so as to selectively generate or eliminate reactive groups capable of substitution under alkaline conditions.

There is no particular limitation on the acid generator which may be suitably selected according to the intended purpose. Preferable examples may include a photo-acid generator and the like.

There is no particular limitation on the base generator which may be suitably selected according to the intended purpose. Preferable examples may include a photo-base generator.

According to the present invention, a photosensitive resin containing at least one of a photo-acid generator and a photo-base generator is particularly preferred. In this case, if the stimulus is light exposure, at least one of an acid and a base is generated due to the action of at least one of the photo-acid generator and the photo-base generator at exposed parts in the photosensitive resin, and this produces the reactive groups capable of substitution under alkaline conditions.

Resins may be broadly distinguished as positive type resins wherein the reactive groups capable of substitution under alkaline conditions are partially generated at parts which receive a stimulus, and negative type resins wherein the reactive groups capable of substitution under alkaline conditions are partially generated at parts which do not receive the stimulus.

In the case of a positive type resin, the reactive groups capable of substitution under alkaline conditions are generated at parts which receive the stimulus.

It is preferred that the positive type resin has at least one reactive group capable of substitution under alkaline conditions in every repeating unit at parts which receive the stimulus. It is preferred that the resin is a photosensitive resin, more preferred that it is a polyimide and particularly preferred that it is a polyimide containing a photo-acid generator. In the case of a polyimide containing a photo-acid generator, a photo-acid generator is generated in the exposed parts and reactive groups capable of substitution under alkaline conditions are generated due to the action of the acid generator.

The polyimide is formed from a carboxylic acid di-anhydride and a diamine compound.

Examples of the carboxylic acid di-anhydride are pyromellitic acid dianhydride, benzophenone tetracarboxylic acid dianhydride, 3,3',4,4'-biphenyl tetracarboxylic acid dianhydride, 2,2-bis(3,4-benzene dicarboxylic acid anhydride)perfluoropropane, bis(3,4-dicarboxyl phenyl)dimethylsilane anhydride, 1,3-bis(3,4-dicarboxyl phenyl)-1,1,3,3-tetramethyldisiloxane anhydride, 2,2-bis[4-(3,4-dicarboxy phenoxy)phenyl]propane dianhydride, and 1,1,3,3-tetramethyl-1,3-bis[4-(1,2,3,6-tetrahydrophthalic anhydride)]disiloxane, and the like. These may be used independently, or in combination of two or more.

Examples of the diamine compound are p-phenylenediamine, m-phenylenediamine, 4,4'-diamino diphenylmethane, 4,4'-diaminodiphenyl ether, 2,2'-bis(4-amino phenyl)propane, 4,4'-diaminodiphenylsulfone, 4,4'-diaminodiphenyl sulfide, 1,4-bis(3-aminophenoxy)benzene, 1,4-bis(4-amino phenoxy)benzene, 1,4-bis(m-amino phenylsulfonyl)benzene, 1,4-bis(p-amino phenylsulfonyl) benzene, 1,4-bis(m-amino phenyl thioether)benzene, 1,4-bis(p-amino phenyl thioether)benzene, 2,2'-bis[4-(4-aminophenoxy)phenyl]propane, 2,2'-bis[3-methyl-4-(4-aminophenoxy)phenyl]propane, 2,2'-bis[3-chloro-4-(4-amino phenoxy)phenyl]propane, 1,1'-bis[4-(4-aminophenoxy)phenyl]ethane, 1,1'-bis[3-methyl-4-(4-aminophenoxy)phenyl]ethane, 1,1'-bis[3-chloro4-(4-aminophenoxy)phenyl]ethane, 1,1'-bis[3,5-dimethyl-4-(4-aminophenoxy)phenyl]ethane, bis[4-(4-aminophenoxy)phenyl]methane, bis[3-methyl-4-(4-amino phenoxy)phenyl]methane, bis[3-chloro-4-(4-aminophenoxy)phenyl]methane, bis[3,5-dimethyl-4-(4-aminophenoxy)phenyl]methane, bis[4-(4-aminophenoxy)phenyl]sulfone, and 2,2'-bis[4-(4-aminophenoxy)phenyl]perfluoropropane, and the like. These may be used independently, or in combination of two or more.

In the case of a negative type resin, reactive groups capable of substitution under alkaline conditions are generated at parts which are not stimulated.

In the negative type resin, it is preferred that there is at least one reactive group capable of substitution under alkaline conditions in every repeating unit at the parts which are not stimulated. Of these, photosensitive resins are preferred, the polyamic acid represented the following structural formula is more preferred, and polyamic acids containing a photo-base generator are particularly preferred. Polyamic acids containing a photo-base generator contain the aforesaid reactive groups capable of substitution under alkaline conditions. In the exposed parts, the base generator is produced, and reactive groups capable of substitution under alkaline conditions are eliminated by the action of the base generator.

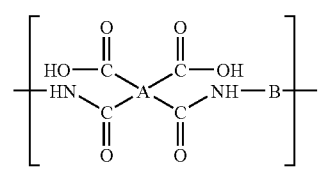

structural formula 1

In the structural formula 1, A and B respectively represent aromatic groups or aliphatic groups, and may be identical or different.

Reactive Groups Capable of Substitution Under Alkaline Conditions

There is no particular limitation on the reactive groups capable of substitution under alkaline conditions, as long as parts of them can be substituted under alkaline conditions. They may be suitably selected according to the intended purpose. For example, acidic groups may be suitably used, specifically the carboxyl (COOH) group, sulfonic acid ($SO_3H$) group, and the like. Of these, the carboxyl (COOH) group is preferred. In the resin, one, two or more of the reactive groups capable of substitution under alkaline conditions may be produced, there being no particular limitation on their number in the resin, but it is preferred that there is one or more in the repeating unit of the resin at the parts where the reactive groups capable of substitution under alkaline conditions are selectively generated.

If the resin in the aforesaid step for generating reactive group is the photosensitive polyimide, a polyamic acid having a repeating unit represented by the following structural formula is for example produced in the exposed parts when the resin is exposed to a light stimulus. In this case, the reactive groups capable of substitution under alkaline conditions are carboxyl (COOH) groups.

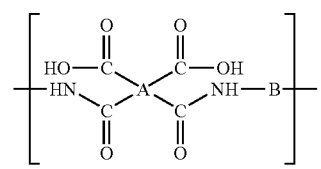

structural formula 2

In the structural formula 2, A and B respectively represent aromatic groups or aliphatic groups, and may be identical or different.

In the process for forming the surface-conductive resin according to the present invention, the surface of the resin which has been treated by the aforesaid step for generating reactive group is then brought in contact with an alkaline solution so that parts of the reactive groups are substituted by alkali metal ions. Hereafter, this process may be referred as "step for substituting by alkali metal ion".

Alkaline Solution

Regarding a hydroxyl [OH—] ion concentration of the aforesaid alkaline solution, it is preferred that, in order to ensure the reaction takes place and to prevent deterioration of the resin, the concentration is about 0.01 mol/l or more, and more preferred that it is within the approximate range of 0.01 mol/l to 0.1 mol/l.

The pH of the alkaline solution is preferably in the range of 8 to 11, more preferably 9 to 10. When the pH is within the aforesaid numerical range, an efficient substitution by alkali metal ions can be achieved without deteriorating the resin (converting it to a lower molecular weight, and the like.)

There is no particular limitation on the aforesaid alkaline solution provided that it contains alkali metal ions, examples being aqueous sodium carbonate solution, aqueous sodium bicarbonate solution, aqueous potassium carbonate solution, aqueous potassium bicarbonate solution and aqueous calcium carbonate solution. These may be used independently, or in combination of two more. It is preferred to select one or more of aqueous sodium carbonate solution, aqueous sodium bicarbonate solution, aqueous potassium carbonate solution, aqueous potassium bicarbonate solution and aqueous calcium carbonate solution as the pH of the alkaline solution can easily be adjusted within the aforesaid preferred range, and they provide a source of the aforesaid alkali metal ions.

There is no particular limitation on the alkali metal ions contained in the aforesaid alkaline solution which may be conveniently selected according to the purpose, examples being sodium (Na), potassium (K) and calcium (Ca). These may be used independently, or in combination of two or more. It is preferred to select one or more of sodium (Na), potassium (K) and calcium (Ca).

There is no particular limitation on the source of the aforesaid alkali metal ions which may be suitably selected according to the intended purpose. Preferable examples may include sodium and the like contained in the aforesaid aqueous sodium carbonate solution or aqueous sodium bicarbonate solution used as the alkaline solution. In this case, it is advantageous that adjusting the pH and applying the stimulus to the alkali metal ion can be performed at the same time.

Contact

There is no particular limitation on the contact process which may be suitably selected according to the intended purpose. Preferable examples may include a process of immersion in the alkaline solution, a process of applying the alkaline solution, and the like. Of these, the process of immersion in the alkaline solution is preferred from the viewpoint of effectiveness of substitution.

In the aforesaid step for substituting by alkali metal ion, when for example the resin is a photosensitive polyimide, as shown below, carboxyl groups in the photosensitive polyimide are brought in contact with the alkaline solution so that they are substituted by alkali metal ions (here, an example with potassium ions is shown).

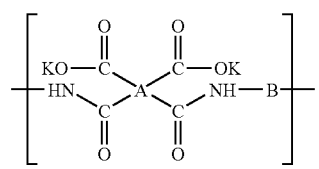

structural formula 3

In the structural formula 3, A and B respectively represent aromatic groups or aliphatic groups, and may be identical or different.

In the process for forming the surface-conductive resin of the present invention, the surface of the resin which has been treated in the aforesaid step for substituting by alkali metal ion is brought in contact with an ionic solution of a conductive material, and the alkali metal ions are thereby substituted by ions of the conductive material. Hereafter, this process may be referred to as "step for substituting by ion".

Ionic Solution of Conductive Material

There is no particular limitation on the conductive material which may be suitably selected according to the intended purpose. Preferable examples may include metals and alloys of metals.

Examples of metals are silver (Ag), gold (Au), cobalt (Co), nickel (Ni), copper (Cu), platinum (Pt), palladium (Pd) and rhodium (Rh). Of these, metals having a nobler ionization tendency than that of cobalt (Co) are preferred as they can deposit efficiently on the resin surface. These may be used independently, or in combination of two or more.

As examples of the ionic solution, aqueous solutions of metallic salts may be preferably mentioned. Preferable examples of the metallic salts may include nitrates, sulfates and hydrochlorides. These ionic solutions may be used independently, or in combination of two or more.

The concentration of the ionic solution is preferably of the order of 0.01 M to 1.0M, more preferably 0.02 M to 0.1M.

When the concentration of the ionic solution is within the aforesaid preferred range, the alkali metal ions which substituted by the reactive groups capable of substitution under alkaline conditions are efficiently substituted by ions of the conductive material, and this effect is particularly remarkable within the aforesaid more preferred range.

Contact

There is no particular limitation on the contact process which may be suitably selected according to the intended purpose. Examples may include a process of immersion in the ionic solution of the conductive material, a process of applying the ionic solution of the conductive material. Of these, the process of immersion in the ionic solution of the conductive material is preferred from the viewpoint of effectiveness in substitution.

In the aforesaid step for substituting by ion, when the resin is a photosensitive polyimide, as shown below, the alkali metal ions (potassium ions) in the photosensitive polyimide which substituted in the aforesaid step for substituting alkali metal, are substituted by ions of the conductive material (here, an example with silver ions is shown).

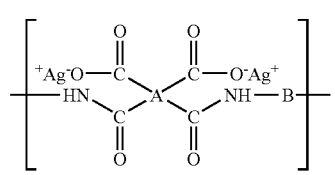

structural formula 4

In the structural formula 4, A and B respectively represent aromatic groups or aliphatic groups, and may be identical or different.

In the process for forming the surface-conductive resin of the present invention, the ions of the conductive material are subsequently reduced so that the conductive material deposits on the surface of the resin. Hereafter, this process may be referred to as "step for reducing".

Reduction

There is no particular limitation on the step for reducing as long as the ions of the conductive material can be reduced. They may be suitably selected from among those known in the art. Preferable examples may include the use of reducing agents, light and the like.

There is no particular limitation on the reducing agent which may be suitably selected from those known in the art. Preferable examples may include sodium borohydride, sodium hypophosphate and the like. These may be used independently, or in combination of two or more. Of these, at least one of sodium borohydride and sodium hypophosphite is preferred.

As the light, for example, an active light such as ultraviolet light may be suitably selected.

There is no particular limitation on the reduction conditions which may be suitably selected. For example, the temperature is preferably in the range of 0° C. to 100° C., more preferably 25° C. to 50° C., and the time is preferably in the range of 1 hour to 30 hours, more preferably 2 hours to 10 hours. If the aforesaid reducing agents are used in the reduction, the concentration of reducing agent is preferably in the range of 0.01M to 1M, more preferably 0.05M to 0.10M.

The whole or parts of the resin surface may be reduced. In the former case, the conductive material deposits on the whole of the resin surface, and a layer of conductive material is formed over the whole resin surface. In the latter case, the conductive material deposits on a part of the resin surface, and a layer of conductive material is thus formed on the part of the resin surface. In the latter case, the conductive material can be reduced in a pattern, so a pattern of the conductive material can be efficiently formed.

In the aforesaid step for reducing, when the resin is a photosensitive polyimide, as shown below, ions of the conductive material in the photosensitive polyimide which are introduced in the aforesaid step for substituting by ion, are reduced, the conductive material (here, the example of silver is shown) deposits on the resin surface, and a surface-conductive resin containing a surface layer of conductive material, can thus be formed.

structural formula 5

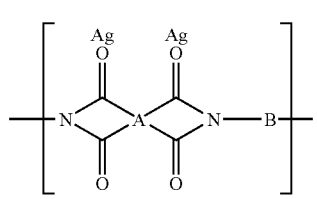

In the structural formula 5, A and B respectively represent aromatic groups or aliphatic groups, and may be identical or different.

In the present invention, it is preferred to cure the resin after the step for reducing, since it improves the strength of the surface-conductive resin obtained.

There is no particular limitation on the curing conditions which may be suitably selected according to the intended purpose. For example, heating at the temperature within 200° C. to 400° C. for 0.5 hour to 3 hours is preferred.

The process for forming the surface-conductive resin of the present invention will now be described referring to the figures.

Figure 1B:
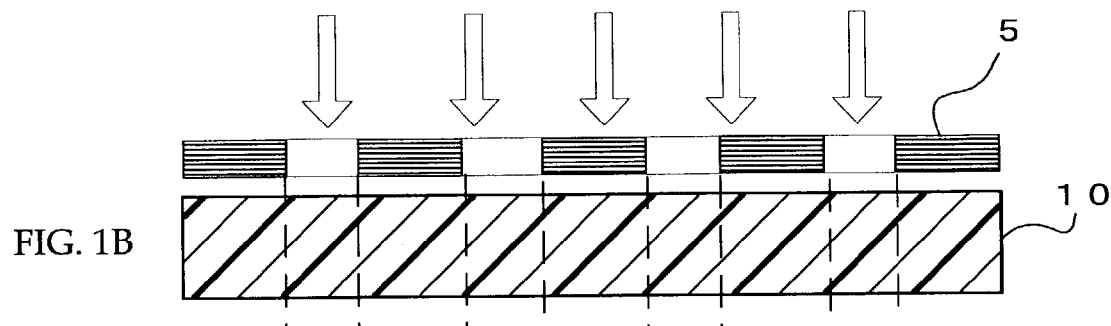
Figure 1C:
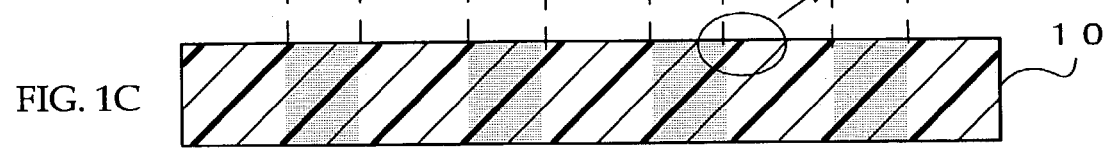
Figure 1D:
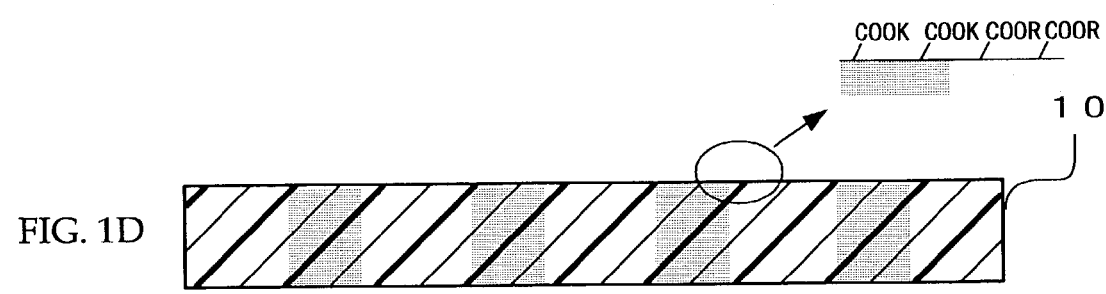
Figure 2E:
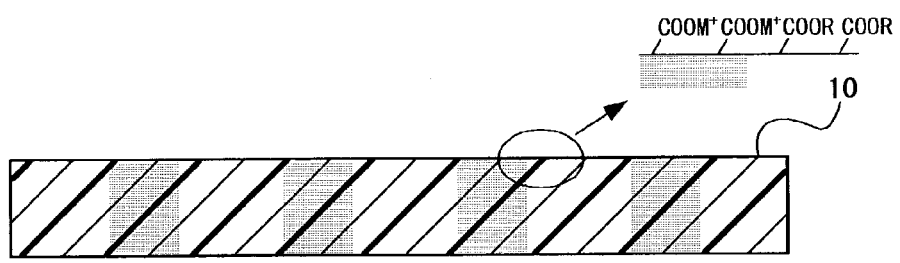
FIGS. 2E and 2F are schematic diagrams (2) for the purpose of describing an example of the process for forming a surface-conductive resin using a positive photosensitive resin, wherein a partial pattern of a conductive material is formed on the surface.
Figure 2F:
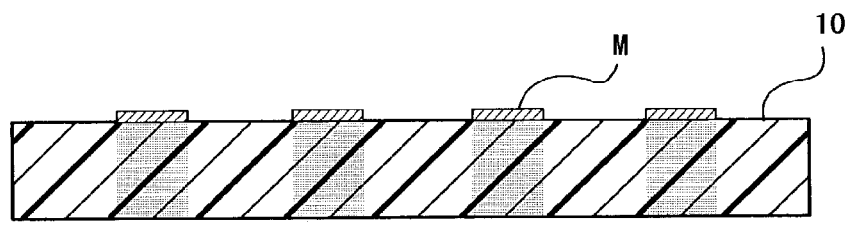

An example is now given where the resin is a positive type photosensitive polyimide, and the stimulus is light exposure. First of all, the photosensitive polyimide is applied on a substrate (not shown), and dried to form a layer 10 of photosensitive resin (polyimide layer), as shown in FIG. 1A. Next, the surface of the photosensitive layer 10 (polyimide layer) is exposed to light through a pattern mask 5, as shown in FIG. 1B. In this process, carboxyl (—COOH) groups are selectively generated and a polyamic acid is produced in the parts exposed to light through the pattern mask 5, as shown in FIG. 1C. Next, the resin is immersed in an alkaline solution (e.g., $KHCO_3$ solution: 0.1M), and the hydrogen atoms in the carboxyl (—COOH) groups formed only in these exposed parts are substituted by potassium ions to give —COOK, as shown in FIG. 1D. Next, by immersion in a solution containing metal ions ($M^+$), the potassium ions in —COOK are substituted by metal ions ($M^+$) to give —COO$M^+$, as shown in FIG. 2E. Subsequently, by immersion in a reducing agent, the metal (M) partially deposits on the exposed parts, and by curing this with the action of heat, a surface-conductive resin having a patterned surface layer of the metal (M) can be formed, as shown in FIG. 2F.

Figure 4E:
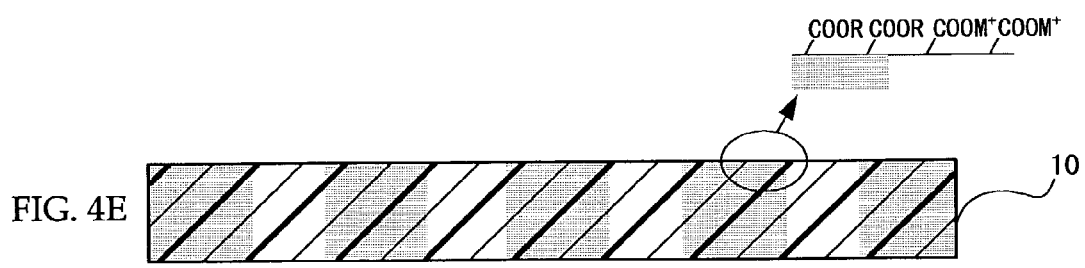
FIGS. 4E and 4F are schematic diagrams (2) for the purpose of describing an example of the process for forming a surface-conductive resin using a negative photosensitive resin, wherein a selective pattern of a conductive material is formed on the surface.
Figure 4F:
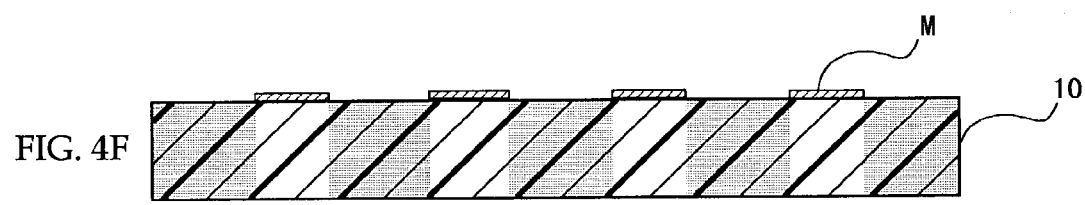

Moreover, an example is given where the resin is a negative type photosensitive polyamic acid, the stimulus being light exposure. First of all, the photosensitive polyamic acid is applied on a substrate (not shown), and dried to form the layer 10 of photosensitive resin (polyamic acid layer), as shown in FIG. 3A. Next, the surface of the photosensitive layer 10 (polyamic acid layer) is exposed to light through the pattern mask 5, as shown in FIG. 3B. In this process, carboxyl (—COOH) groups remain in the unexposed parts covered by the pattern mask 5, and carboxyl (—COOH) groups are eliminated in the exposed parts, as shown in FIG. 3C. Next, the resin is immersed in an alkaline solution (e.g., $KHCO_3$ solution: 0.1M), and the hydrogen atoms in the carboxyl (—COOH) groups remaining only in these unexposed parts are substituted by potassium ions to give —COOK, as shown in FIG. 3D. Next, by immersion in a solution containing metal ions ($M^+$), the potassium ions in —COOK are substituted by the metal ions $M^+$ to give —COO$M^+$, as shown in FIG. 4E. Subsequently, by immersion in a reducing agent, the metal (M) partially deposits in the unexposed parts, and by curing this with the action of heat, a surface-conductive resin having a patterned surface layer of the metal (M) can be formed, as shown in FIG. 4F.

The process for forming the surface-conductive resin of the present invention is suitable for wiring boards, and the like, and permits the formation of a surface-conductive resin having excellent electrical properties and surface flatness by low cost, efficient and simple process without the use of a vacuum device. The process for forming the surface-conductive resin of the present invention is particularly suitable for the formation of the surface-conductive resin according to the present invention described hereafter.

(Surface-Conductive Resin)

The surface-conductive resin of the present invention is formed by the process for forming the surface-conductive resin of the present invention, and contains a surface layer of a conductive material.

There is no particular limitation on the thickness of the layer of conductive material which may be conveniently selected according to the application and purpose, it is of the order of, for example, 1 μm to 50 μm and preferably 5 μm to 20 μm.

The thickness of the layer of conductive material may also be increased, decreased and removed by non-electrolytic plating, sputtering, etching and the like.

The surface-conductive resin of the present invention can be used in a wide variety of applications which require the use in combination of a layer of conductive material and resin, and as the aforesaid metal layer has excellent contact properties and durability, it may be suitably used for wiring boards, coaxial cables, and the like, and is particularly suitable for the wiring board of the present invention described below.

(Wiring Board)

There is no particular limitation on the wiring board of the present invention provided that it is formed of a layer of conductive material which is deposited as a pattern on the surface of the surface-conductive resin, in other words, provided that it contains at least the surface-conductive resin layer and the conductive material layer according to the present invention. Its shape, structure and size may be suitably selected according to the intended purpose, and it may be designed as a monolayer circuit (monolayer wiring board) or as a multilayer circuit (multilayer wiring board). In the latter case, the wiring board of the present invention may be laminated onto an LSI, a wiring board and the like.

Here, the production of the wiring board of the present invention will be described referring to the figures.

Figure 5:
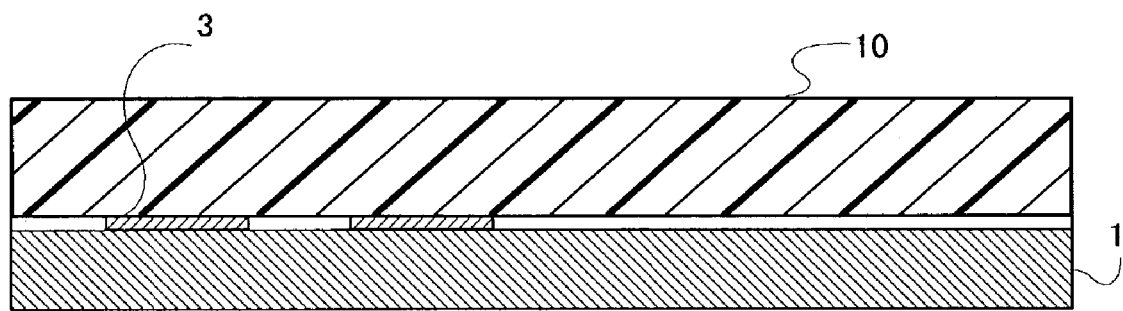
FIG. 5 is a schematic diagram showing an example of the formation of a photosensitive resin (photosensitive polyimide) film.
Figure 6:
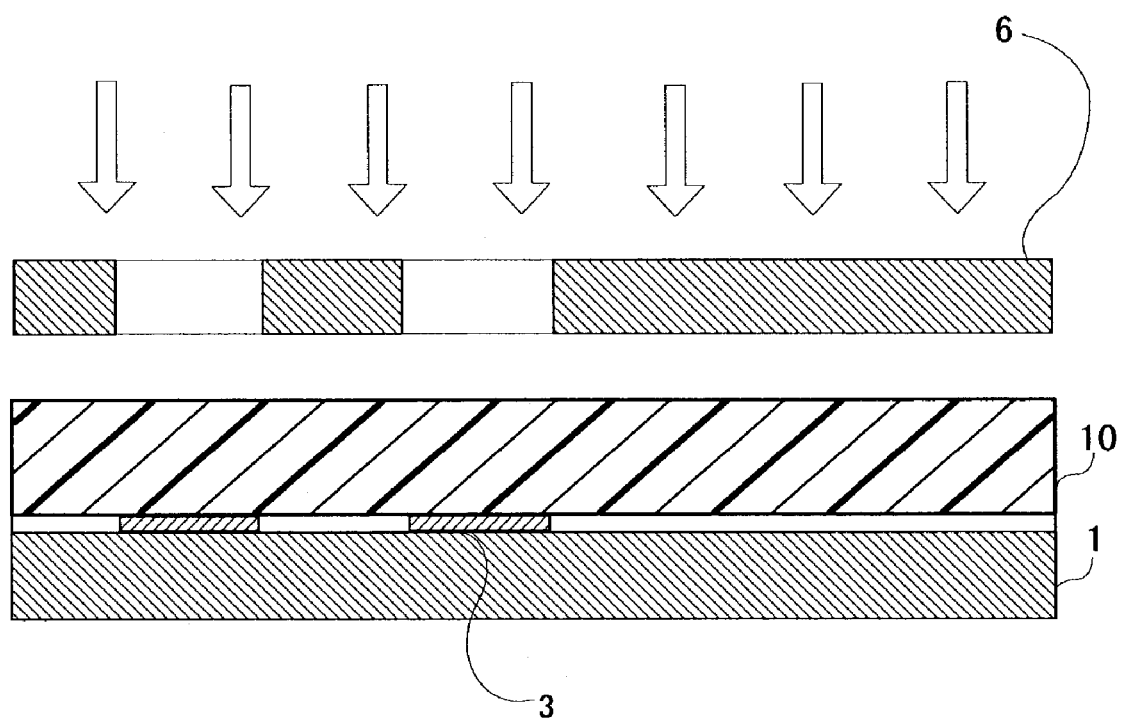
FIG. 6 is a schematic diagram showing an example of the patterning of the photosensitive resin (photosensitive polyimide) film in FIG. 5.
Figure 7:
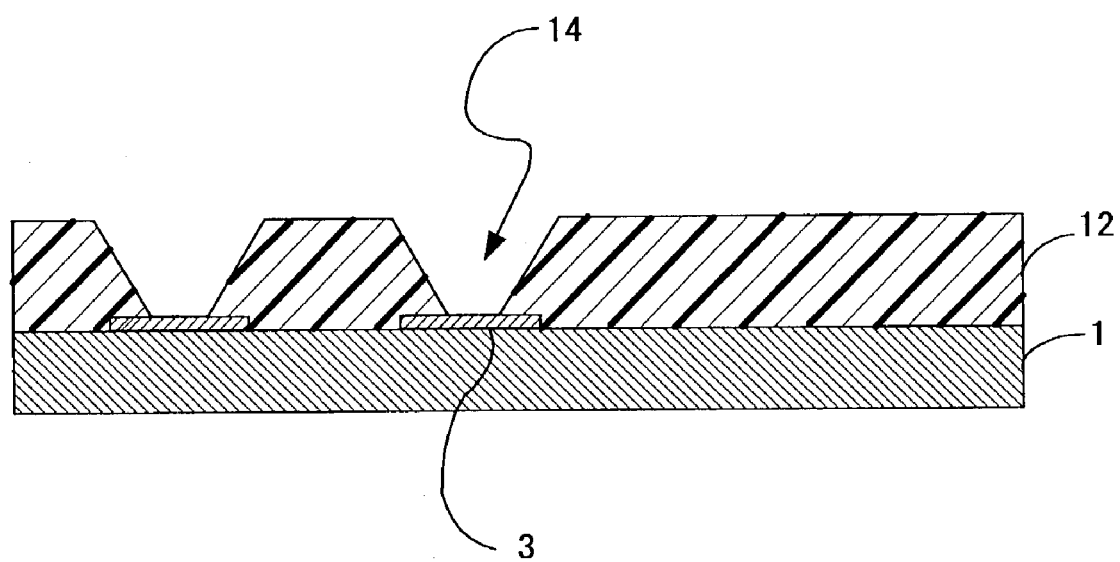
FIG. 7 is a schematic diagram showing an example of the formation of a via hole in the photosensitive resin (photosensitive polyimide) in FIG. 5.
Figure 8:
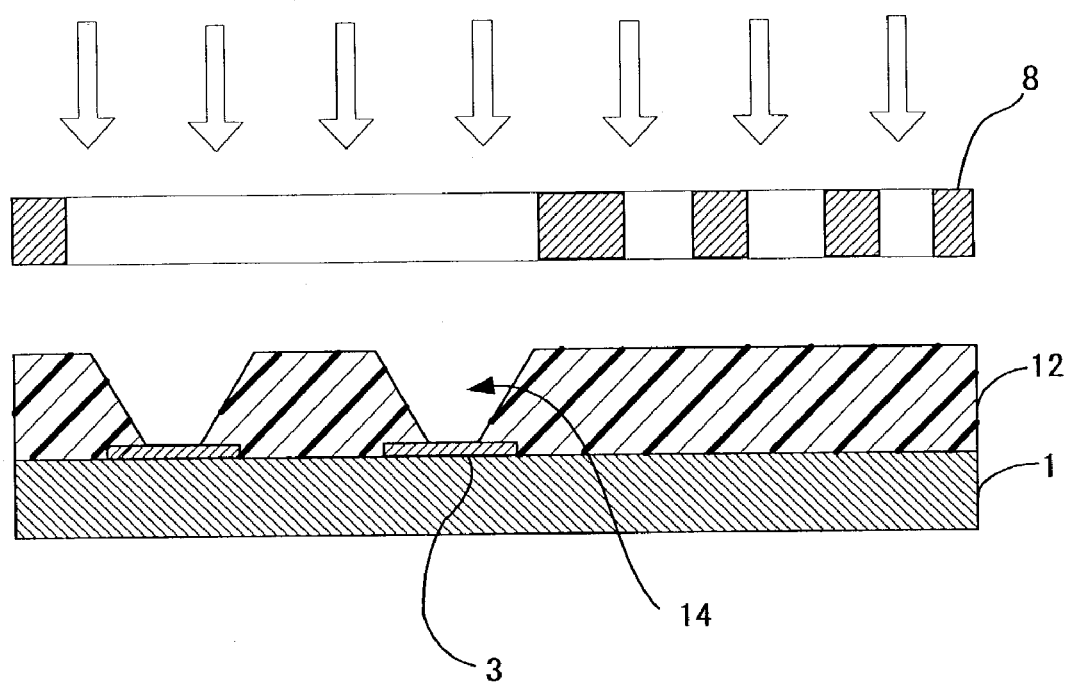
FIG. 8 is a schematic diagram showing an example of the patterning a plated reducing layer on the film having a via hole in FIG. 7.
Figure 9:
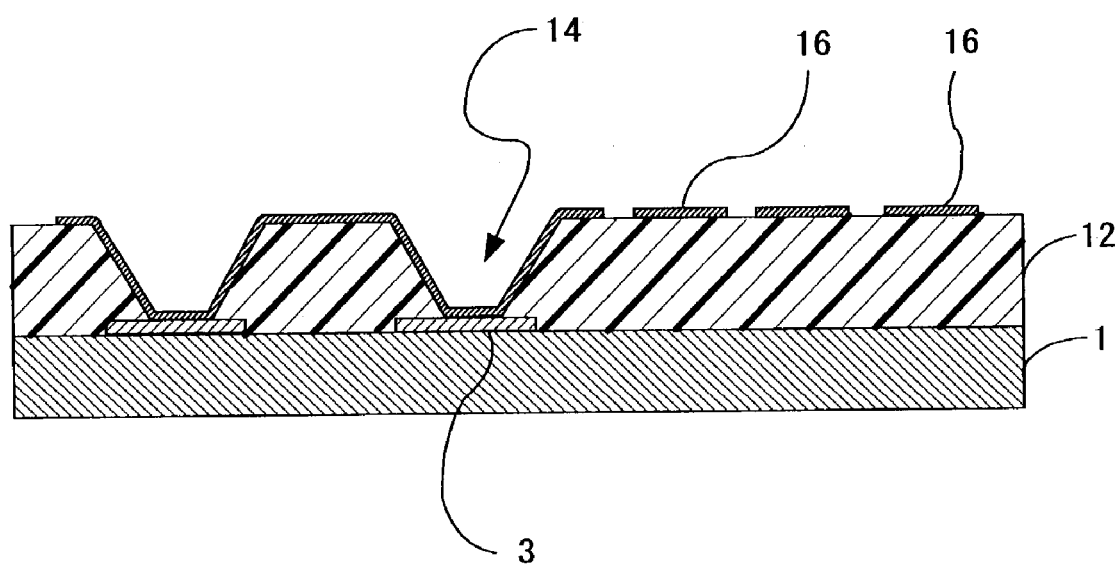
FIG. 9 is a schematic diagram showing an example of a wiring board of a surface-conductive resin, wherein a patterning layer is formed on the surface.
Figure 10:
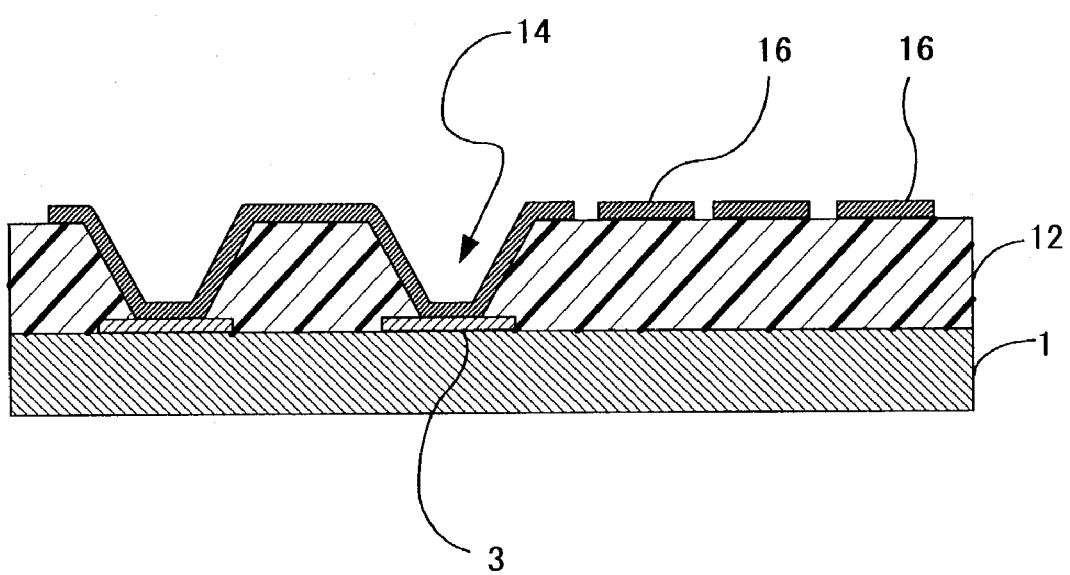
FIG. 10 is a schematic diagram showing an example of the state that the surface of the wiring board shown in FIG. 9 is thickened by non-electrolytic Cu plating.

First of all, a film 10 of a photosensitive resin (photosensitive polyimide) is formed by applying a photosensitive polyimide on a substrate 1, and drying, as shown in FIG. 5. A metal layer 3 is disposed between the substrate 1 and photosensitive resin (photosensitive polyimide) film 10 at a position corresponding to a position where a via hole for inter-layer connection is formed. Next, the surface of the photosensitive resin (photosensitive polyimide) film 10 is exposed to light through a pattern mask 6, as shown in FIG. 6, and a via hole 14 is formed at a predetermined position to expose the metal layer 3 as shown in FIG. 7. Subsequently, the photosensitive resin (photosensitive polyimide) film 10 is cured to form a photosensitive resin (photosensitive polyimide) layer 12. Next, the surface of the photosensitive resin (photosensitive polyimide) layer 12 is exposed to light through a pattern mask 8 for forming a wiring pattern so that, for example, carboxyl (—COOH) groups are partially generated in the exposed parts and a polyamic acid is produced, as shown in FIG. 8. After being immersed in an alkaline solution, it is immersed in an ion solution of the conductive material. By performing the aforesaid reduction treatment, a plating seed layer is formed in the exposed parts where the conductive material is selectively reduced. Subsequently, it is cured by heating so that a wiring pattern 16 is formed by the layer of conductive material, as shown in FIG. 9. Next, after thickening by non-electrolytic Cu plating, the sequence of operations is repeated so as to form a multilayer circuit (multilayer wiring board), as shown in FIG. 10.

The wiring board of the present invention is formed using the surface-conductive resin of the present invention, so it is of high-quality and has excellent durability. Costly equipment such as a vacuum device is not required for its production. Further, a wiring pattern having hardly any surface imperfections and excellent surface flatness is formed, so it can also transmit high frequency signals, can be employed in various fields and is suitable for use in a multilayer wiring board.

An embodiment of the present invention will now be described in detail, it should be understood that the present invention is in no way limited thereto.

A photosensitive polyamic acid film was formed by spin coating a photosensitive polyamic acid (JR-3240P, Nitto Denko Corporation) as the resin on a silicone wafer as the substrate, and drying at 85° C. for 30 minutes. This film was exposed to light (exposure amount: 1500 mJ/cm², full wavelength) through a mask pattern, and PEB (Post Exposure Bake) was performed at 165° C. for 10 minutes. In this film, carboxyl groups remained in the unexposed parts, while in the exposed parts, carboxyl groups were eliminated and a polyimide was produced. This film was immersed in NaHCO₃ (1M) as the alkaline solution for 2 minutes, rinsed with water, immersed in CuSO₄ (0.1M) as the ion solution of conductive material for 5 minutes, rinsed with water, and immersed in NaBH₄ (0.01M) as the reducing agent for 5 minutes. In the unexposed parts of the film, metal Cu separated with uniform thickness, whereas in the exposed parts of the film, there was no deposition of metal Cu remained, thus a surface-conductive resin containing a mask-shaped metal Cu pattern having excellent flatness was obtained. The surface resistance of the Cu was 0.1 ohm per square, and its electrical properties were excellent.

The present invention satisfies the aforesaid demand, and resolves the problems inherent in the related art. It provides a surface-conductive resin suitable for wiring boards, and the like containing a conductive layer having excellent electrical properties and surface flatness, at low cost, by an efficient process for forming the surface-conductive resin in simple processes without using a vacuum device, and a wiring board containing the surface-conductive resin which can be formed efficiently at low-cost without using a vacuum device, and which has excellent electrical properties and surface flatness.

What is claimed is:

1. A process for forming a surface-conductive resin, comprising steps of:
   selectively irradiating light on a polyimide resin surface, thereby producing a polyamic acid having the structural formula:

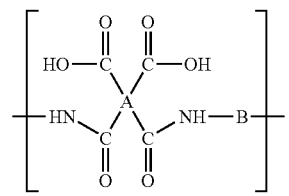

wherein A and B represent aromatic groups or aliphatic groups and may be identical or different, and thereby generating reactive groups, wherein the reactive groups are capable of substitution under alkaline conditions,
   bringing the reactive groups into contact with an alkaline solution so as to substitute parts of the reactive groups by alkali metal ions;
   bringing the substituted parts by the alkali metal ions into contact with an ion solution of a conductive material so as to substitute the alkali metal ions by ions of the conductive material; and
   reducing the ions of the conductive material so as to deposit the conductive material on the resin surface.

2. A process for forming a surface-conductive resin according to claim 1, wherein the polyimide resin contains a photo-acid generator.

3. A process for forming a surface-conductive resin according to claim 1, wherein the irradiated parts of the resin have at least one reactive group capable of substitution under alkaline conditions in every repeating unit.

4. A process for forming a surface-conductive resin according to claim 1, wherein the polyimide resin is a photosensitive resin.

5. A process for forming a surface-conductive resin according to claim 4, wherein the conductive material is deposited on the surface of the photosensitive resin, and the photosensitive resin is then cured.

6. A process for forming a surface-conductive resin according to claim 1, wherein the light exposure is performed through a pattern mask.

7. A process for forming a surface-conductive resin according to claim 1, wherein the concentration of a hydroxyl [OH⁻] ion in the alkaline solution is 0.01 mol/l or more.

8. A process for forming a surface-conductive resin according to claim 1, wherein the pH of the alkaline solution is in the range of 8 to 11.

9. A process for forming a surface-conductive resin according to claim 1, wherein the reactive groups capable of substitution under alkaline conditions are carboxyl groups.

10. A process for forming a surface-conductive resin according to claim 1, wherein the ions of the conductive material are metal ions which have a nobler ionization tendency than that of cobalt.

11. A process for forming a surface-conductive resin according to claim 1, wherein the ions of the conductive material are reduced by a reducing agent.

12. A surface-conductive resin, comprising:
a resin as a resin layer of the surface-conductive resin; and
a conductive material as a surface layer of the surface-conductive resin, wherein the surface-conductive resin is formed by the process according to claim 1.

13. A surface-conductive resin according to claim 12, wherein the surface-conductive resin is used for a wiring board.

14. A wiring board, comprising:
a surface-conductive resin; and
a patterned layer of a conductive material on a surface of the surface-conductive resin, wherein the surface-conductive resin is formed by the process according to claim 1.

15. A wiring board according to claim 14, wherein the patterned layer of the conductive material is thickened by at least one of non-electrolytic plating and electrolytic plating.

16. A wiring board according to claim 14, wherein the wiring board has a multilayered structure.

17. A process for forming a surface-conductive resin, comprising steps of:
selectively irradiating light to a resin surface so as to eliminate reactive groups where irradiated, wherein parts of the resin where not irradiated comprise the reactive groups, and the reactive groups are capable of substitution under alkaline conditions;
bringing the reactive groups into contact with an alkaline solution so as to substitute parts of the reactive groups by alkali metal ions;
bring the substituted parts by the alkali metal ions into contact with an ion solution of a conductive material so as to substitute the alkali metals ions by ions of the conductive material; and
reducing the ions of the conductive material so as to deposit the conductive material on the resin surface,
wherein the resin is a photosensitive resin containing a photo-base generator.

18. A process for forming a surface-conductive resin according to claim 17, wherein the photosensitive resin is polyamic acid.

19. A process for forming a surface-conductive resin according to claim 17, wherein the light exposure is performed through a pattern mask.

20. A process for forming a surface-conductive resin according to claim 17, wherein the concentration of hydroxyl [OH⁻] ion in the alkaline solution is 0.01 mol/l or more.

21. A process for forming a surface-conductive resin according to claim 17, wherein the pH of the alkaline solution is in the range of 8 to 11.

22. A process for forming a surface-conductive resin according to claim 17, wherein the reactive groups capable of substitution under alkaline conditions are carboxyl groups.

23. A process for forming a surface-conductive resin according to claim 17, wherein the ions of the conductive material are metal ions which have a nobler ionization tendency than that of cobalt.

24. A process for forming a surface-conductive resin according to claim 17, wherein the ions of the conductive material are reduced by a reducing agent.

25. A process for forming a surface-conductive resin according to claim 17, wherein the conductive material is deposited on the surface of the photosensitive resin, and the photosensitive resin is then cured.

26. A surface-conductive resin, comprising:
a resin as a resin layer of the surface-conductive resin; and
a conductive material as a surface layer of the surface-conductive resin, wherein the surface-conductive resin is formed by the process according to claim 17.

27. A wiring board, comprising:
a surface-conductive resin; and
a patterned layer of a conductive material on a surface of the surface-conductive resin, wherein the surface-conductive resin is formed by the process according to claim 17.

* * * * *